Aug. 17, 1965 H. F. WELSH 3,201,041

FLUID SHIFT REGISTER

Filed March 23, 1964

INVENTOR
HERBERT FRAZER WELSH, DECEASED,
BY JULEA S. CHAPLINE, EXECUTRIX

BY Griffin and Stokes

ATTORNEYS

United States Patent Office 3,201,041
Patented Aug. 17, 1965

3,201,041
FLUID SHIFT REGISTER

Herbert Frazer Welsh, deceased, late of Philadephia, Pa., by Julea S. Chapline, executrix, Philadelphia, Pa., assignor to Sperry Rand Corporation, New York, N.Y., a corporation of Delaware Filed Mar. 23, 1964, Ser. No. 355,527
6 Claims. (Cl. 235—201)

The present invention relates to shift registers or delay lines of the type employed to store data in digital data processing or contol systems. The present invention provides fluid shift registers wherein the only moving part is the working fluid and only one bistable fluid amplifier element is required for each stage of the registers.

Fluid shift registers employing bistable fluid amplifiers are well known. However, the shift registers now known require two amplifier configurations in each stage for accomplishing the storage and shifting functions. An object of this invention is to provide a pure fluid shift register having only one amplifier configuration, there being one amplifier in each stage of the register.

An object of this invention is to provide a multistage pure fluid shift register having only one bistable amplifier in each stage, each of said amplifiers being responsive to fluid control signals from a preceding stage and an intermittently applied power stream pulse for applying fluid control signals to a succeeding stage.

Another object of this invention is to provide fluid operated shift registers requiring less power than fluid shift registers heretofore known.

Still another object of the present invention is to provide a fluid shift register having a plurality of stages, each stage of said register having a fluid amplifier. The output signals from each amplifier are attenuated before being applied to the control nozzles of the amplifier in the next stage, said output signals, after attenuation, being of sufficient magnitude to determine the direction of flow of a power stream as said power stream is initiated but of insufficient magnitude to change the direction of power stream flow through an amplifier once said flow is established. A source of fluid shift pulses is provided for intermittently initiating power stream flow in each amplifier. The output signals from each amplifier are delayed for a period of time at least as long as the interval of time between two successive shift pulses before being applied to the control nozzles of the amplifier in the next stage whereby the output signals from a given amplifier resulting from one shift pulse are applied to the control nozzle of the next amplifier before and during the time the next shift pulse occurs.

Other objects of the invention and its mode of operation will become apparent upon consideration of the following description and the accompanying drawing in which.

Figure 1:
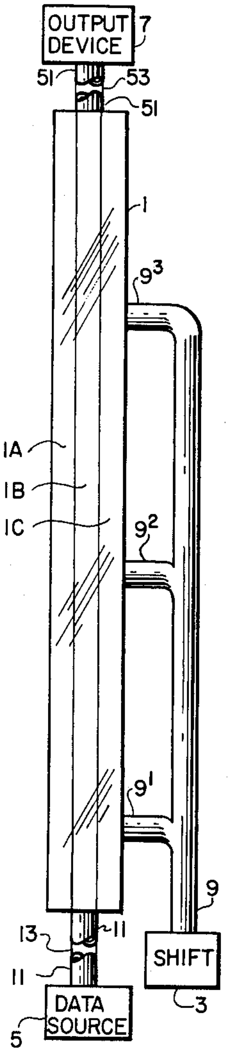
FIGURE 1 is a side view of a typical embodiment of the invention.
Figure 2:
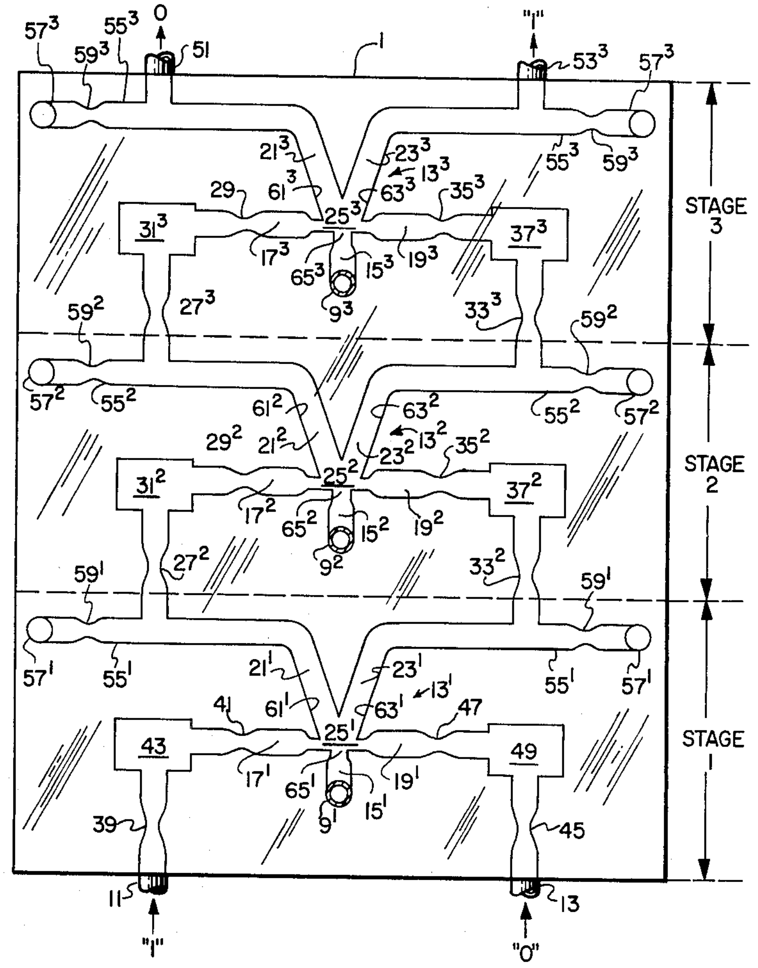
FIGURE 2 shows the configuration of channels for a shift register constructed in accordance with the principles of the present invention.

Referring now to FIGURES 1 and 2, a typical system employing the present invention comprises a multistage binary shift register 1, a source of fluid shift pulses 3, a data source 5 for producing fluid signals representing the binary values zero and one, and an output device 7 for receiving fluid output signals from the shift register.

Shift pulse source 3 may be any source for intermittently producing fluid pulses and may, for example, be a pure fluid oscillator or an electrically actuated fluid valve of conventional design. Shift pulses produced by source 3 are conveyed to each stage of the shift register by a tube, channel or other fluid conveying means 9.

Data source 5 may, for example, comprise one or more fluid logic elements such as fluid amplifiers or one or more electrically actuated fluid valves of conventional design. Data source 5 selectively produces fluid signals at one of two outputs and these signals are conveyed by means of tubes, channels or other fluid conveying means 11 and 13 to the first stage of the shift register.

Shift register 1 may comprise three flat plates 1A, 1B, and 1C with plate 1A being a solid backing plate, plate 1B having a configuration of channels and chambers formed therein as shown in FIGURE 2, and plate 1C having holes therein communicating with various channels of plate 1B so that fluid may be applied to, or removed from, the channels formed in plate 1B. This mode of construction is more fully described in U.S. Patent No. 3,001,698 and is given here by way of illustration only. Other modes of construction are equally suitable for use in constructing shift registers in accordance with the present invention.

In order to more easily illustrate the channel and chamber configuration in plate 1B, the shift register is shown in FIGURE 2 as being made of a clear plastic material. Only three stages of the register are shown but it will be obvious from the following description that additional stages may be added as desired. Like elements in each stage bear the same reference numeral with a superscript added to designate the appropriate stage.

Each stage of the shift register includes a bistable fluid amplifier 13 having a power nozzle 15, first and second control nozzles 17 and 19, first and second output channels 21 and 23, and an interaction chamber 25.

Output channel 21 of the amplifier in each stage except the last is connected to the control nozzle 17 of the amplifier in the next succeeding stage through a fluid conducting means which includes attenuating means such as flow restrictors 27 and 29 and signal delay means such as a chamber, cavity, or other fluid capacitance 31. In like manner, output channel 23 of the amplifier in each stage except the last is connected to the control nozzle 19 of the amplifier in the next succeeding stage through a fluid conducting means which includes attenuating means 33 and 35 and a delay means 49.

Output channels $21^3$ and $23^3$ of the amplifier in the last stage of the register are connected to pipe 51 and 53 which convey output signals from the register to an external device which may, for example, be another fluid shift register.

Two bleed-off means are provided for each stage of the register. Each bleed-off means comprises a fluid conducting path 55 connected at one end to an output channel 21 or 23 and terminating at the other end at a vent or opening 57. A flow restrictor 59 is included intermediate the vent and the output channel for the purpose of limiting the amount of fluid escaping through the vent while at the same time permitting the escape of that portion of the fluid flowing in the output channel that cannot flow through the flow restrictor 27 or 33 of the succeeding stage.

Bistable fluid amplifiers 13 are each constructed in the manner described in U.S. Patent No. 3,001,698, but are switched from one stable state to the other in a manner which differs from that described in the patent.

As described in the aforementioned patent, a constant stream of fluid applied to power nozzle 15 emerges from the nozzle as a high velocity jet which attaches or "locks on" to one or the other of walls 61 and 63 as a result of a low pressure region created near the wall by the action of the power jet. If the power jet locks on to wall 61 then the entire power jet flows along this wall and into output channel 21. This state of flow is maintained as long as the power jet continues to flow provided a control signal of sufficient magnitude is not applied to nozzle 17. This state of flow defines one stable state of the amplifier.

The aforementioned patent further discloses that the amplifier can be switched to a second stable state wherein the power jet locks on to wall 63 and flows into output channel 23. This is accomplished by applying fluid in sufficient quantity to control nozzle 17. The fluid enters chamber 25 and flows into the low pressure region adjacent wall 61 thus increasing the pressure in this region. If a sufficient quantity of fluid is applied to nozzle 17 then more fluid enters the region near wall 61 than can be removed by the power jet. The pressure increases in this region until the power jet breaks away from wall 61 and swings toward wall 63. The power jet then locks on to wall 63 in the same manner as it locks on to wall 61.

The amplifier may be switched back to its second stable state by applying fluid to control nozzle 19 to thereby increase the pressure adjacent wall 63 and break the power jet away from its "locked-on" condition.

In the present invention the amplifiers 13 are switched from one stable state to the other by fluid signals of insufficient magnitude to increase the pressure adjacent to wall 61 or 63 to the point where the power jet breaks away from the wall. This is accomplished by intermittently applying fluid to the power nozzle 15 to thereby intermittently initiate a power jet. Fluid signals of relatively small magnitude are selectively applied to control nozzles 17 and 19 so that a small fluid flow is established across the orifice 65 where fluid enters chamber 25 from the power nozzle. This small flow is of sufficient magnitude to deflect a power jet at the instant the power jet is initiated but is of insufficient magnitude to overcome the effects of the jet which cause the jet to remain locked on to a wall once it has begun to flow.

If the small flow of control fluid is from nozzle 17 at the time the power jet is initiated then it deflects the power jet closer to wall 63 and the jet assumes a stable state during which it flows into output channel 23. On the other hand, if the small flow of control fluid is from nozzle 19 at the time the power jet is initiated then it deflects the power jet closer to wall 61 and the jet assumes a stable state during which it flows into output channel 21.

The operation of the shift register may best be understood by considering a specific numerical example. Assume that it is desired to enter the binary value 101 into the register with fluid signals representing binary ones being applied to the register over pipe 11 and fluid signals representing binary zeros being applied to the register over pipe 13.

In order to enter the first binary one into the register fluid is applied to pipe 11 and this fluid flows through restriction 39, chamber 43, restriction 41 and nozzle $17^1$ and enters chamber $25^1$. Flow restrictors 39 and 41 limit the amount of fluid entering chamber 25 said amount being sufficient to deflect a power jet as the power stream begins to flow but insufficient to deflect a power jet from one of its stable states. Chamber 43 serves as a fluid capacitance causing a delay between the time fluid first flows into the register from pipe 11 and the time fluid first flows from nozzle $17^1$ into chamber $25^1$.

While fluid is still flowing into chamber $25^1$ from nozzle $17^1$, the shift pulse source 3 applies a fluid shift pulse to power nozzle $15^1$. This shift pulse is also applied at the same time to nozzles $15^2$ and $15^3$. The shift pulse applied to nozzle $15^1$ causes a power jet to begin to flow in chamber $25^1$. The power jet is deflected by the small control flow issuing from nozzle $17^1$ so that it moves closer to wall $63^1$ than wall $61^1$. As the jet becomes more fully established it locks on to wall $63^1$ and flows into output channel $23^1$. This condition is an indication that a binary one is stored in the first stage of the register.

Once the power jet of amplifier $13^1$ becomes established the control flow from nozzle $17^1$ may be terminated. The amplifier maintains its stable state as long as the shift pulse is applied to nozzle $15^1$. The power jet of amplifier $13^1$ flows through channel $23^1$, flow restrictor $33^2$, fluid capacitance $37^2$, flow restrictor $35^2$, and control nozzle $19^2$ and enters the chamber of amplifier $13^2$. However, the flow of fluid into chamber $25^2$ is limited by flow restrictors $33^2$ and $35^2$ to an amount which is insufficient to affect the power stream which is flowing through the chamber in one or the other of two stable paths.

In order to enter a binary zero into stage 1 and transfer the binary one from stage 1 to stage 2, the first shift pulse must be terminated and then a second shift pulse applied to the power nozzles.

As soon as the first shift pulse is terminated the power jets stop flowing into chambers $25^1$ and $25^2$. However, because of fluid capacitance $37^2$ there is a predetermined delay or interval of time between the time the power jet stops flowing into chamber $25^2$ from control nozzle $19^2$. During this interval source 3 begins applying a second shift pulse to the power nozzle of each amplifier.

As stated before, the fluid control signal representing the first binary one can be terminated at nozzle $17^1$ any time after the first shift pulse establishes a power jet in chamber $25^1$. Furthermore, the fluid signal representing the second binary digit, a zero in the assumed example can be applied to the amplifier $13^1$ anytime after the first shift pulse establishes a power jet in chamber $25^1$. The reason is that the flow restrictors limit the rate at which fluid can be applied to the chamber, this rate being so small that the power jet is not unlocked from the chamber wall to which it is attached.

Although the fluid control signal representing the second binary digit may be applied to amplifier $13^1$ while the power jet resulting from the first fluid shift pulse is still flowing therein, it may also be first applied to the amplifier during the interval between the termination of the first shift pulse and the initiation of the second shift pulse. In either case, the only requirement is that the control signal be limited in magnitude, as indicated above, and flowing into chamber 25 by the time the second shift pulse occurs.

Returning now to the numerical example under consideration, the following conditions exist at the instant the second shift pulse is applied to power nozzles 15. Fluid representing a binary zero is entering chamber $25^1$ from nozzle $19^1$. Fluid representing the binary one previously stored in amplifier $13^1$ is entering chamber $25^2$ from nozzle $19^2$.

As the power jet first begins to flow into chamber $25^1$ as a result of the second shift pulse it is deflected toward wall $61^1$ by the small flow of fluid across orifice $65^1$ from nozzle $19^1$. As the power jet becomes established it locks on to wall $61^1$ and flows into output channel $21^1$. This is a stable state of flow representing a binary zero and it is maintained as long as the power jet continues to flow from nozzle $15^1$.

As the power jet first begins to flow into chamber $25^2$ as a result of the second shift pulse it is deflected toward wall $61^2$ by the small flow of fluid across orifice $65^2$ from nozzle $19^2$. As the power jet becomes established it locks on to wall $61^2$ and flows into output channel $21^2$. This is as table state of flow representing a binary zero and it is maintained as long as the power jet continues to flow from the nozzle $15^2$.

The power jet entering output channel $21^1$ as the second shift pulse is applied to nozzle $15^1$ is delayed by fluid capacitance $31^2$ so that it does not enter chamber $25^2$ until after the second shift pulse has caused the power jet to become established in chamber $25^2$. This prevents the newly established zero condition of amplifier $13^1$ from being immediately transferred to amplifier $13^2$ and at the same time permits the one condition of amplifier $13^1$ to be established in amplifier $13^2$. Stated differently, capacitance $31^2$ relays the zero signal so that it cannot interfere with the binary one signal applied to chamber $25^2$ during the time the second shift pulse is initiated, the binary one signal being an indication of the status of amplifier $13^1$ during the first shift pulse. Flow restrictors $27^2$ and $29^2$ limit the flow of the zero signal so that once it does begin to emerge from orifice $17^2$ it does not have sufficient power to unlock the power jet from wall $61^2$.

Between the time of initiation of the second shift pulse and the time of initiation of the third shift pulse the following actions take place. The second shift pulse is terminated thus stopping power jet flow in all amplifiers. The fluid stream resulting from the second shift pulse applied to amplifier $13^2$ passes through channel $21^2$ and is delayed in capacitance $31^3$ before it begins flowing from orifice $17^3$ into chamber $25^3$. The fluid stream resulting from the second shift pulse applied to amplifier $13^1$ passes through channel $21^2$ and is delayed in capacitance $31^2$ before it begins flowing from orifice $17^2$ into chamber $25^2$. A fluid stream representing the third binary digit being entered into the shift register is applied to pipe 11 and after being delayed by capacitance 43 begins flowing from orifice $17^1$ into chamber $25^1$. Also fluid flow from nozzles $19^1$, $19^2$ and $19^3$ into the corresponding chambers 25 is terminated.

Therefore, at the time the third shift pulse is applied to power nozzles $15^1$, $15^2$, and $15^3$ there are small flows of control fluid from nozzles $17^1$, $17^2$, and $17^3$ which deflect the power jets toward walls $63^1$, $63^2$, and $63^3$, respectively. As the power jets become established they lock on to these walls and flow into output channels $23^1$, $23^2$, and $23^3$, respectively. As stated previously, power jet flow into channel $23^2$ represents a binary zero and power jet flow into channel $23^1$ represents a binary one. Fluid flow into channel $23^3$ indicates that a binary one is stored in stage 3 and this condition may be sensed by sensing the fluid flow in output pipe 52.

Readout of the remaining digits stored in the register may be accomplished by applying further shift pulses. By terminating the third shift pulse and applying a fourth shift pulse the binary zero in stage 2 may be shifted to stage 3 at the same time the binary one in stage 1 is shifted to stage 2. The manner in which this is accomplished is believed obvious from the preceding description. During the fourth shift pulse the power stream of amplifier $13^3$ flows into channel $21^3$ to represent a binary zero and this condition may be sensed by sensing fluid flow in output pipe 51.

Termination of the fourth shift pulse and initiation of a fifth shift pulse causes the binary one in stage 2 to be transferred to stage 3 and this may be sensed in pipe 53.

During the fourth and fifth shift pulses two additional binary digits may be entered into the shift register, if desired, by applying the appropriate fluid signals to input pipes 11 and 13.

From the above description it is seen that the present device is admirably suited for use as a dynamic delay line with the shift pulses being applied at intermittent intervals. If desired, the output signals from the last stage of the register may be connected to the inputs of the first stage to provide a recirculating data storage register.

From the above description it becomes obvious that shift registers constructed in accordance with the present invention require less operating power than fluid shift registers heretofore known. The lower power requirement is due primarily to the fact that the amplifier power streams are not on continuously. A further reduction in the power requirement is made possible because control signals for switching the amplifiers do not have to be of sufficient magnitude to overcome the "lock-on" effect.

While a preferred embodiment of the invention has been shown and described herein, various modifications falling within the spirit and scope of the invention will be obvious. For example, fluid vortex amplifiers of the type described in copending application Serial No. 135,-824 filed September 5, 1961 may be substituted for the amplifiers shown herein. Also, "single-sided" amplifiers of the type now known in the art may be used in a shift register system where binary ones are represented by the presence of fluid flow in a particular output channel and binary zeros are represented by the absence of fluid flow. In cases where the input signals are of the proper magnitude and timing the delay means and flow restrictors of the first stage may be eliminated.

The embodiments of the invention in which an exclusive property or privilege is claimed are defined as follows:

1. A binary shift register comprising: a plurality of fluid amplifiers each having power nozzle means for issuing a fluid power stream, output channel means for selectively receiving said power stream, and control nozzle means for selectively directing said power stream into said output channel means, each of said amplifiers having first and second stable states manifested by first and second paths of stable power stream flow from said power nozzle into said output channel means; means for generating a series of fluid pulses occurring serially in time; means for applying said generated pulses to the power nozzle means of each of said amplifiers; a plurality of means for connecting said amplifiers in series, said connecting means being connected between the output channel means of one amplifier and the control nozzle means of the next amplifier, said connecting means including means for delaying a fluid signal applied thereto for at least as long as the interval of time between successive pulses produced by said generator means and means for limiting the magnitude of said delayed signals to a magnitude sufficient to determine the direction of power stream flow as a power stream is initiated but insufficient to switch an amplifier from one stable state to the other.

2. The combination comprising: a plurality of bistable fluid amplifiers each having a power stream nozzle for issuing a power stream, first and second output channels, and first and second control nozzles for selectively directing said power stream into said first and second output channels; a plurality of fluid conveying means for connecting the first and second output channels of one of said amplifiers to the first and second control nozzles, respectively, of another of said amplifiers, each of said conveying means including attenuating means for limiting the magnitude of control pulses applied to said first and second control nozzles to values greater than that required to influence the direction of flow of a power stream at the instant the power stream is initiated but less than that required to change the direction of flow of a power stream once it has become established; and means for applying a series of fluid pulses to said power stream nozzles, each of said conveying means including delay means for delaying a fluid pulse for at least as long as the interval of time between consecutive pulses of said series.

3. A binary shift register comprising a series of bistable fluid amplifiers each having a power nozzle, first and second output channels, and first and second control nozzles; a plurality of fluid signal conveying means for connecting the first and second output channels of each amplifier in said series to the first and second control nozzles of the next amplifier in said series; means for generating a series of fluid shift signals; means for applying each of said shift signals to each of said power nozzles, said conveying means each including delay means whereby a shift signal applied to the power nozzle of one amplifier is present at a control nozzle of the next succeeding amplifier at the time the next succeeding shift signal is applied to said amplifiers, each of said conveying means further including attenuating means for limiting signals reaching said control nozzles to magnitudes less than that required to switch said amplifiers from one stable state to the other.

4. A binary shift register as claimed in claim 3 and further comprising: a source of fluid signals representing binary zeros; means for applying said zero-representing signals to the first control nozzle of the first amplifier in said series; a source of fluid signals representing binary ones; and means for applying said ones-representing signals to the second control nozzle of the first amplifier in said series.

5. A binary shift register as claimed in claim 3 and further comprising a plurality of bleed-off means connected to said fluid signal conveying means between the output channels of said amplifiers and said attenuating means.

6. A shift register comprising: means for generating a sequence of fluid shift pulses; a series of bistable fluid amplifiers each having a power nozzle for receiving said shift pulses, first and second output channels, and first and second control nozzles for selectively directing said shift pulses into said first and second output channels; a plurality of fluid conveying means each connecting an output channel of each amplifier in said series to a control nozzle of the next amplifier in said series, each of said conveying means including delay means whereby a shift pulse from said sequence entering the power nozzle of one amplifier in said series is present at a control nozzle of the next amplifier in said series when the next shift pulse of said sequence is applied to the power nozzle of said next amplifier, each of said conveying means further including means for limiting the magnitude of pulses conveyed therethrough to a magnitude less than that required to change a particular amplifier from one stable state to the other during the interval a shift pulse is issuing from the power nozzle of said particular amplifier; and means for selectively applying fluid pulses representing digital data to the first amplifier in said series.

References Cited by the Examiner

UNITED STATES PATENTS

| | | | |
|---|---|---|---|
| 3,001,698 | 9/61 | Warren | 235—201 |
| 3,075,548 | 1/63 | Horton | 235—201 |
| 3,093,306 | 6/63 | Warren | 235—201 |
| 3,107,850 | 10/63 | Warren et al. | 235—201 |
| 3,114,390 | 12/63 | Glattli | 235—201 X |
| 3,128,039 | 4/64 | Norwood | 235—201 |

OTHER REFERENCES

Grubb, H. R.: "Fluid Logic Shift Register With Intermediate Stages," IBM Technical Disclosure Bulletin, vol. 6, No. 1, June 1963, page 24.

Norwood, R. E.: "Generating Times Pneumatic Pulses," IBM Technical Disclosure Bulletin, vol. 5, No. 9, February 1963, page 13.

O. L. Wood and H. L. Fox: "Fluid Computers," International Science and Technology, No. 23, pp. 44–52, November 1963.

Proceedings of the Fluid Amplification Symposium, Diamond Ordnance Fuze Laboratories, vol. 1, October 1962, pp. 143–145.

LEO SMILOW, *Primary Examiner.*